(12) United States Patent
Mischel, Jr. et al.

(10) Patent No.: US 8,835,789 B2
(45) Date of Patent: Sep. 16, 2014

(54) APPARATUSES AND METHODS FOR USING A CAPACITIVE TOUCH CONTROLLER WITH A CONDUCTIVE SURFACE

(75) Inventors: James V. Mischel, Jr., Seattle, WA (US); Ross Divanfard, Kirkland, WA (US); Paul John Ropella, New Berlin, WI (US); Mark Joseph Stefka, Mukwonago, WI (US)

(73) Assignee: Electric Mirror, LLC, Everett, WA (US)

( * ) Notice: Subject to any disclaimer, the term of this patent is extended or adjusted under 35 U.S.C. 154(b) by 563 days.

(21) Appl. No.: 13/068,778

(22) Filed: May 18, 2011

(65) Prior Publication Data

US 2012/0043914 A1      Feb. 23, 2012

Related U.S. Application Data

(60) Provisional application No. 61/395,898, filed on May 18, 2010.

(51) Int. Cl.
    *H03K 17/975*      (2006.01)
    *H03K 17/78*      (2006.01)
    *H03K 17/96*      (2006.01)

(52) U.S. Cl.
CPC .............. *H03K 17/962* (2013.01); *H03K 17/78* (2013.01); *H03K 2217/96077* (2013.01); *H03K 2217/960705* (2013.01)
USPC ............................................. 200/600; 29/622

(58) Field of Classification Search
USPC ......................................................... 200/600
See application file for complete search history.

(56) References Cited

U.S. PATENT DOCUMENTS

| | | | | |
|---|---|---|---|---|
| 6,310,611 | B1* | 10/2001 | Caldwell ........................ | 345/173 |
| 7,307,231 | B2* | 12/2007 | Matsumoto et al. .......... | 200/512 |
| 7,719,142 | B2* | 5/2010 | Hein et al. ..................... | 307/139 |
| 8,093,534 | B2* | 1/2012 | Komada et al. ............. | 219/443.1 |
| 2009/0090611 | A1* | 4/2009 | Zeijlon et al. ................. | 200/600 |
| 2010/0078230 | A1* | 4/2010 | Rosenblatt et al. ......... | 178/18.01 |

* cited by examiner

*Primary Examiner* — Kyung Lee
(74) *Attorney, Agent, or Firm* — Peloquin, PLLC; Mark S. Peloquin, Esq.

(57) ABSTRACT

An apparatus includes a surface; the surface has a conductive layer within a thickness of the surface. A trench is formed in the conductive layer to define a touch area, the touch area is isolated from the rest of the conductive layer. A conductive pickup is mounted on a back side of the surface over the touch area and the conductive pickup is electrically connected to a capacitive touch controller, such that when a user touches the touch area on a front side of the conductive the touch controller responds to the user's touch.

14 Claims, 7 Drawing Sheets

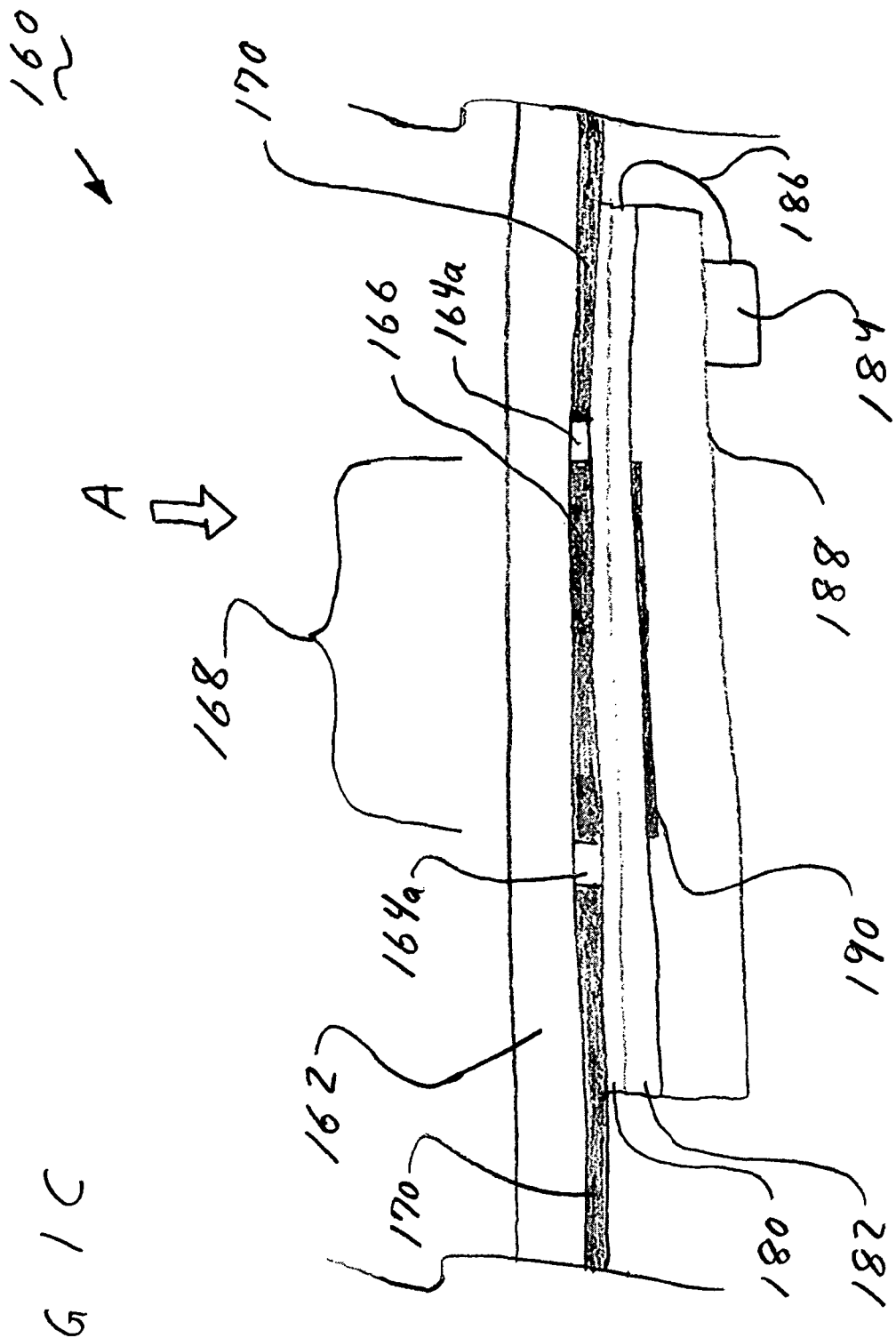

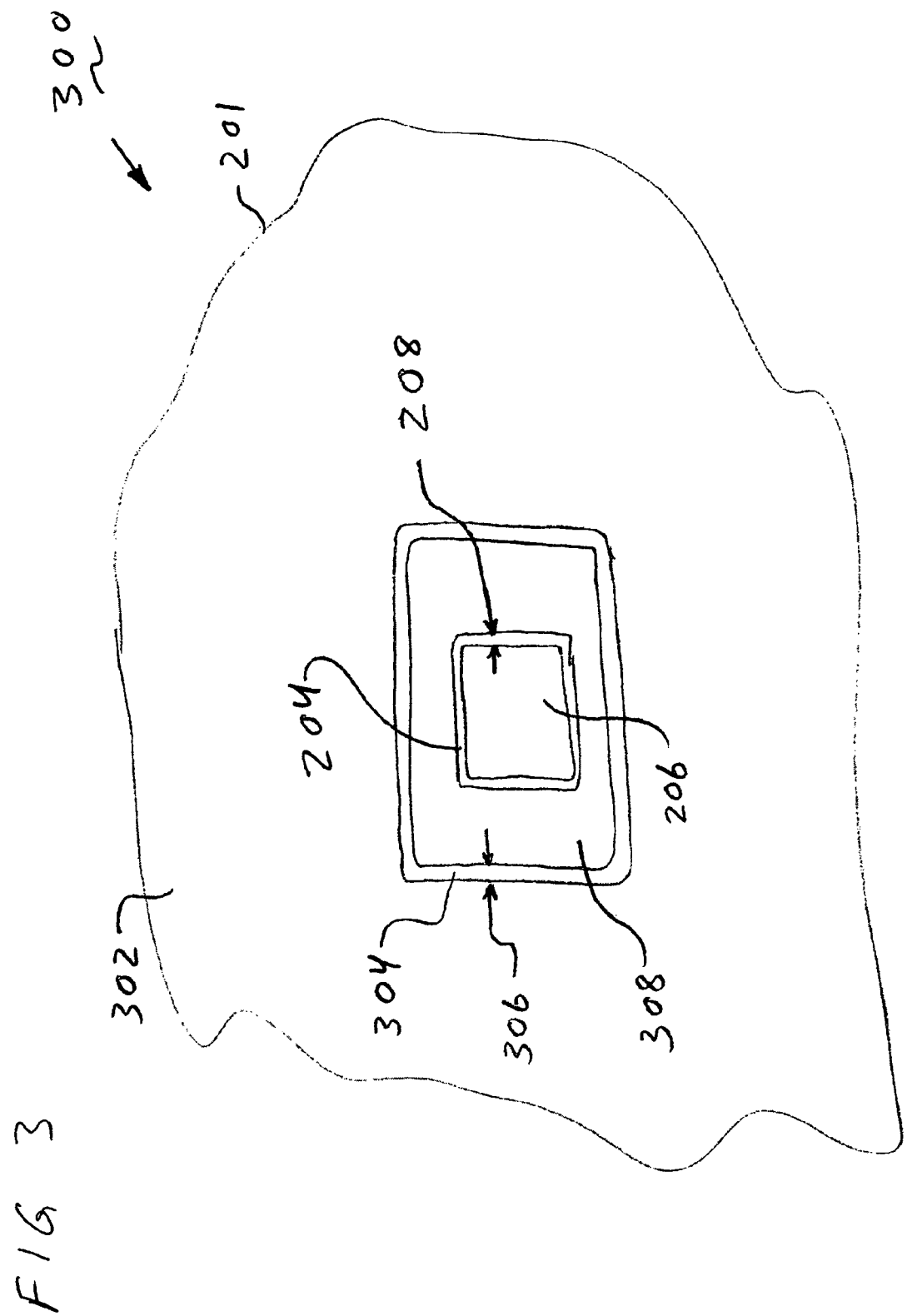

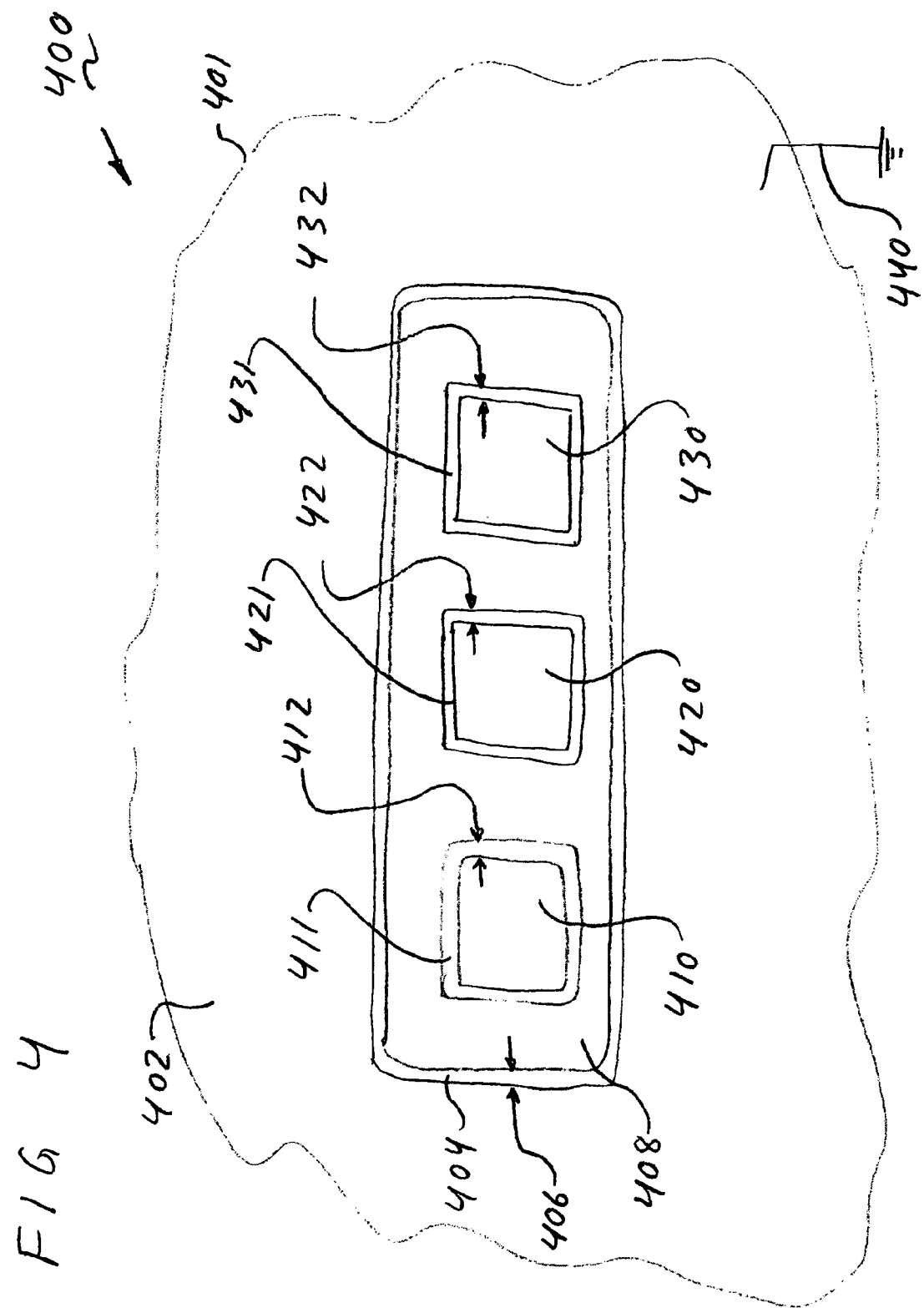

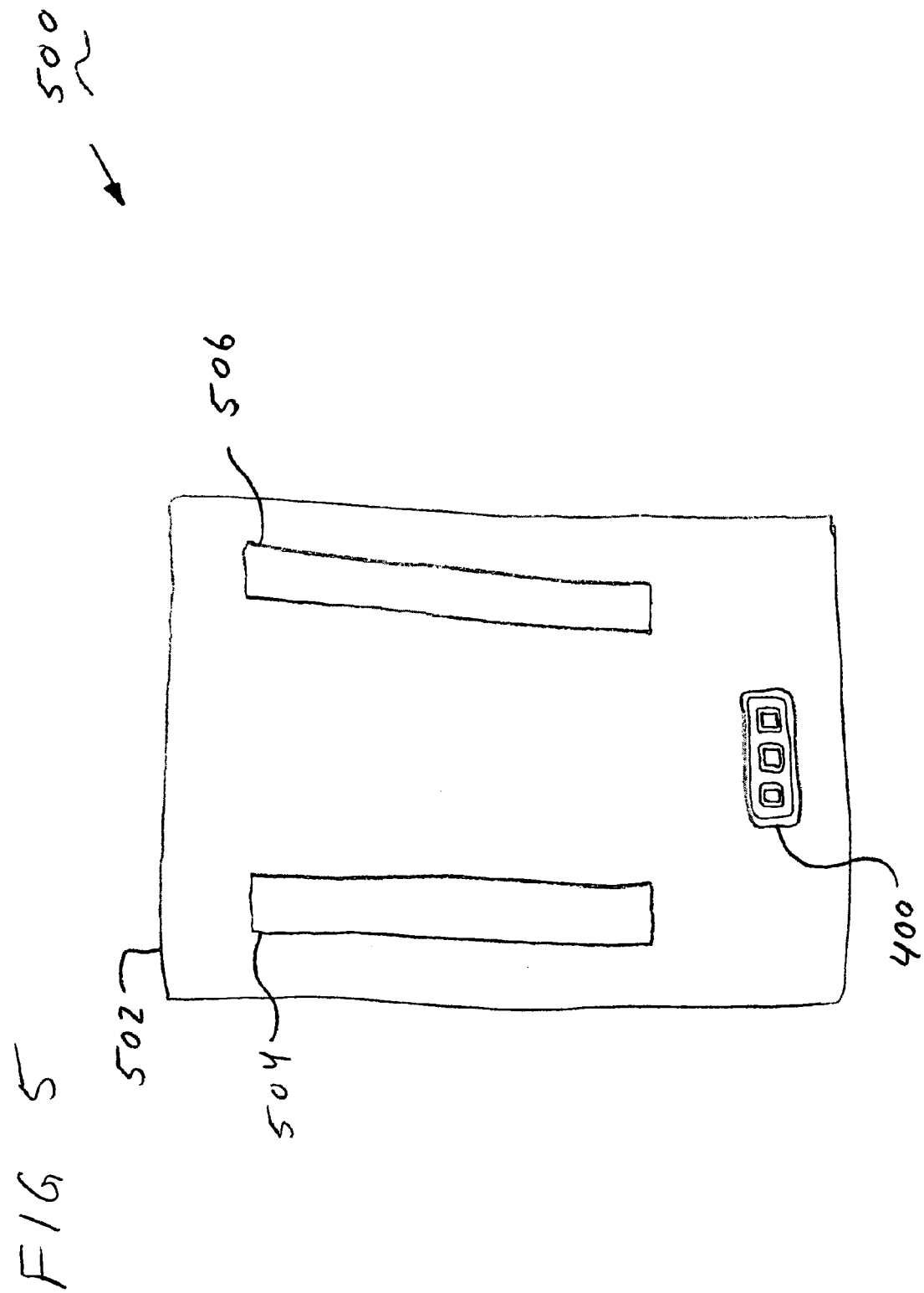

APPARATUSES AND METHODS FOR USING A CAPACITIVE TOUCH CONTROLLER WITH A CONDUCTIVE SURFACE

RELATED APPLICATIONS

This patent application claims priority from U.S. Provisional Patent Application Ser. No. 61/395,898 filed on May 18, 2010 titled "APPARATUSES AND METHODS FOR COMBINING MIRRORS WITH ELECTRONICS" and is hereby incorporated by reference into the present application.

BACKGROUND OF THE INVENTION

1. Field of Invention

The invention relates generally to capacitive touch controllers, and more specifically to combining capacitive touch controllers with a conductive surface.

2. Art Background

Capacitive touch controllers are typically used with non conductive surfaces such as plastic, wood, ceramic, glass, etc. When capacitive touch controllers are used with conductive surfaces or surfaces that have a conductive layer, noise is capacitively coupled into the touch controller resulting in spurious false signals. This can present a problem.

Mirrors are used in various rooms of a dwelling such as in any room of a home, or in a hotel room, such as a bath room, living room, bed room, etc. Often, when a mirror is used indoors, light is needed to adequately illuminate the person using the mirror. Systems embedded into a mirror to provide light generally require controls so that a user can adjust the light. Mechanical switches are often a source of failure resulting in maintenance and expense to repair. This can present a problem.

Various integrations of a mirror surface and electronic devices are used for medicine cabinets and wall mounted mirrors. Such an integration of components provides a person with various functionality such as a local light source that illuminates the person while the person is using the mirror, television programming on an information display incorporated into the mirror, etc. These systems require controls. Mechanical controls are often associated with moving parts that can fail. This can present a problem.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 1C illustrates a cross-section view of a capacitive touch controller and a conductive surface, according to embodiments of the invention.

FIG. 3 illustrates partitioning a conductive area, according to embodiments of the invention.

FIG. 4 illustrates multiple touch areas, according to embodiments of the invention.

FIG. 5 illustrates a capacitive touch control with a mirror, according to embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Apparatuses and methods are described that permit a capacitive touch controller to work with a conductive surface. In various embodiments, a capacitive touch controller is used with a conductive surface to control lighting and other devices. Elements in figures are shown either larger or smaller than actual size to facilitate clarity of illustration. No absolute or relative size information should be inferred therefrom.

Figure 1A:
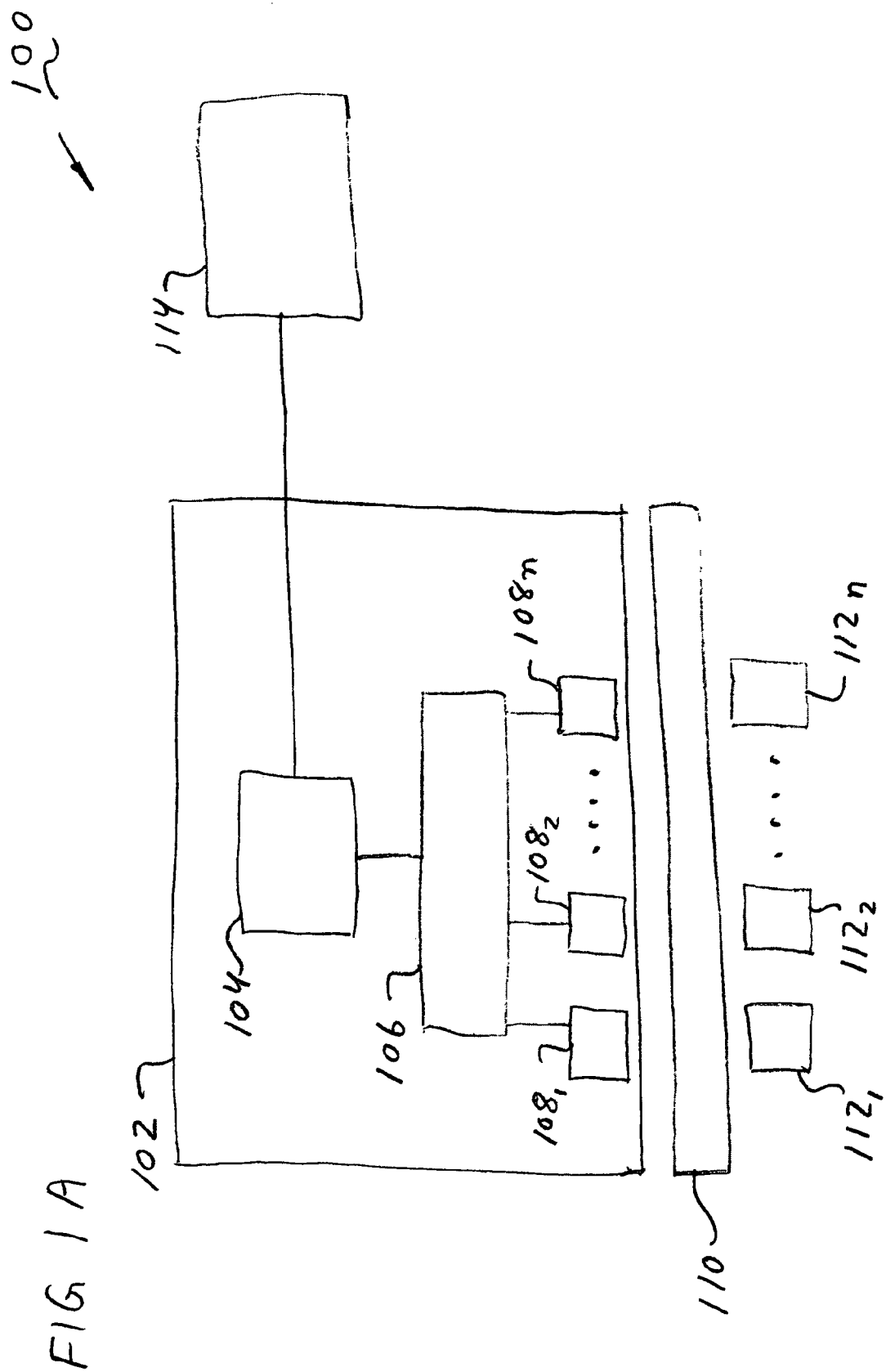
FIG. 1A illustrates a block diagram of a capacitive touch controller, according to one embodiment of the invention.

FIG. 1A illustrates a block diagram of a system, generally at 100, according to embodiments of the invention. With reference to FIG. 1A, in various embodiments, a capacitive touch control system 102 includes a micro-controller unit 104, a capacitive touch controller 106, and number of touch pads designated by $108_1$, $108_2$ up to $108_n$. Alternatively, in some configurations, the micro-controller unit 104 is combined together with the capacitive touch controller 106 into a single chip implementation. Embodiments of the invention are not limited thereby. Touch pads $108_1$, $108_2$ up to $108_n$ are configured on a circuit board as conductive areas, typically copper covered areas of the circuit board. The maximum number of touch pads used is limited by the capacitive touch controller of choice and the number of functions that a designer chooses to control with the system.

A surface is indicated at 110. The surface 110 has a conductive layer located within a thickness of the surface. The conductive layer is partitioned into a number of touch areas such as an $112_1$, an $112_2$ up to an $112_n$. The touch pads $108_1$, $108_2$ up to $108_n$ and the touch areas $112_1$, $112_2$ up to an $112_n$ are sized similarly and aligned so that touch areas over positioned over touch pads.

The micro-controller unit 104 is connected so that the capacitive touch control system can provide a signal that is used to control a desired device, such as a device 114. For example, a signal from the micro-controller unit 104 can be sent to a switch and the switch can turn on and off the desired device 114. Any desired device can be configured to be operated by the capacitive touch control system such as lights, information displays such as monitors, televisions, defoggers, etc.

Figure 1B:
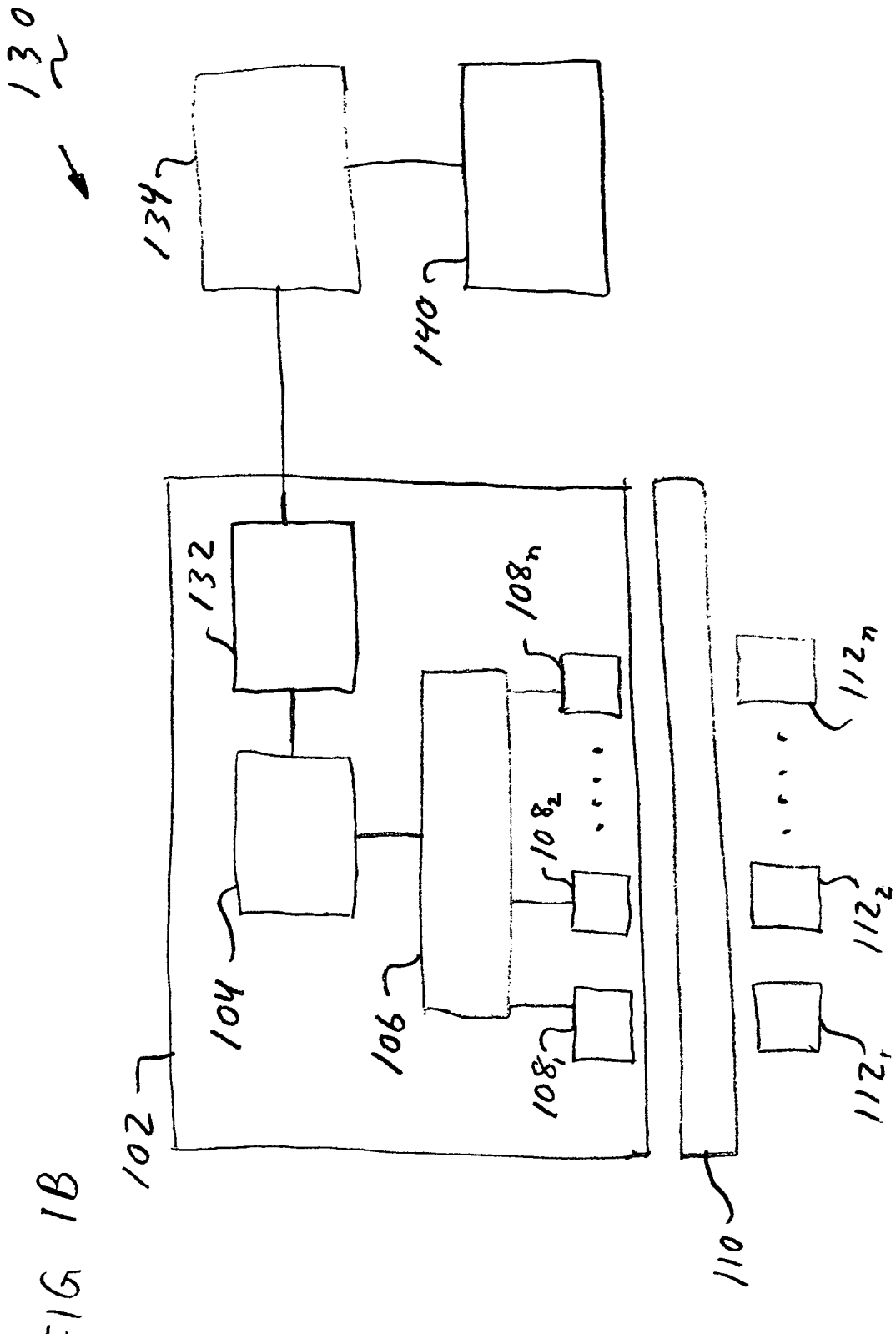
FIG. 1B illustrates another block diagram of a capacitive touch controller, according to embodiments of the invention.

FIG. 1B illustrates another block diagram of a capacitive touch controller, generally at 130, according to embodiments of the invention. With reference to FIG. 1B, the capacitive touch control system 102 is shown with the addition of an optical isolation unit 132. In some embodiments, it is desirable to isolate the capacitive touch control system 102 from the device that is being controlled. If the device that is being controlled has a high level of electrical noise, placing an optical-to-electrical link in between the micro-controller unit 104 and the external device isolates the capacitive touch control system 102 from the high noise level of the external device.

An example of a device that produces a high noise level when connected to a capacitive touch controller is a ballast control device 134 and dimmer for fluorescent lights 140. Signals from the micro-controller unit 104 are converted to optical signals and then back to electrical signals at the optical isolation unit 132. Thereby providing electrical isolation from the ballast control device 134.

FIG. 1C illustrates a cross-sectional view of a capacitive touch controller and a conductive surface, generally at 160, according to embodiments of the invention. With reference to FIG. 1C, a surface 162 extends into the plane of the figure and has two-dimensional extent similar to that illustrated with a surface 201 in FIG. 2. With reference back to FIG. 1C, the surface 162 has a conductive layer 170. A conductive layer such as 170 acts as an antenna picking up unwanted electromagnetic energy (noise) that adversely affects the capacitive touch control system by capacitively coupling this noise into the system, which can then appear as a false touch action, i.e., a false signal. The noise problem increases as the area of the conductive surface increases. As the thickness of the surface 162 increases, a signal resulting from a user touching a touch area decreases, making it hard to detect a user's touch from the background noise presented by the environment. Background noise is reduced by placing a trench 164a around a touch pad area 166 in the conductive layer 170 and as such partitions the conductive layer 170 into the touch pad area. Removal of the conductive layer is implied by use of the term trench. The user touches a region of the surface designated at 168 to trigger the touch pad control.

A capacitive touch control system 188 has a touch pad 190. The capacitive touch control system 188 is positioned against the surface 162 so that the touch pad area 166 is over the touch pad 190. In one embodiment, an optional source of light 184 emits light which is directed via 186 into a layer 182 located on a back side of the surface 162. In various embodiments, 186 is an array of optical fibers that directs light into the layer 182. An adhesive layer 180 attaches the optional layer 182 to the back side of the surface 162. Those of skill in the art will note that additional adhesive layers are used as needed to fix the capacitive touch control system 188 onto the back side of the surface 162. Light emitted from the layer 182 provides a source of backlight to the trenches and moats visible on a front side of the surface 162 when the surface 162 is made of a transparent or translucent material such as glass or plastic.

When a user touches the surface 162 in the region of 168, with his or her finger, the capacitive touch control system 102 outputs a signal that is used to control a device.

As described in this description of embodiments, a conductive layer can be made of any material that conducts electricity such the reflective coating on a mirror, a metal layer, etc. The surfaces described herein, such as 162, are any surface that does not conduct electricity such as glass, wood, plastic, etc. Thus, embodiments of the invention are suited for use on mirrors. Some non-limiting examples of mirrors include mirrors both large and small and deployed in a variety of places such as in bathrooms, living rooms, kitchens, hotel rooms, etc. Mirrors containing embodiments of the invention can be used as standalone units or incorporated into a device such as a medicine cabinet. Thus, the examples given are non-limiting. Embodiments of the invention are not limited to use in any particular device but can be deployed in a variety of devices.

Figure 2:
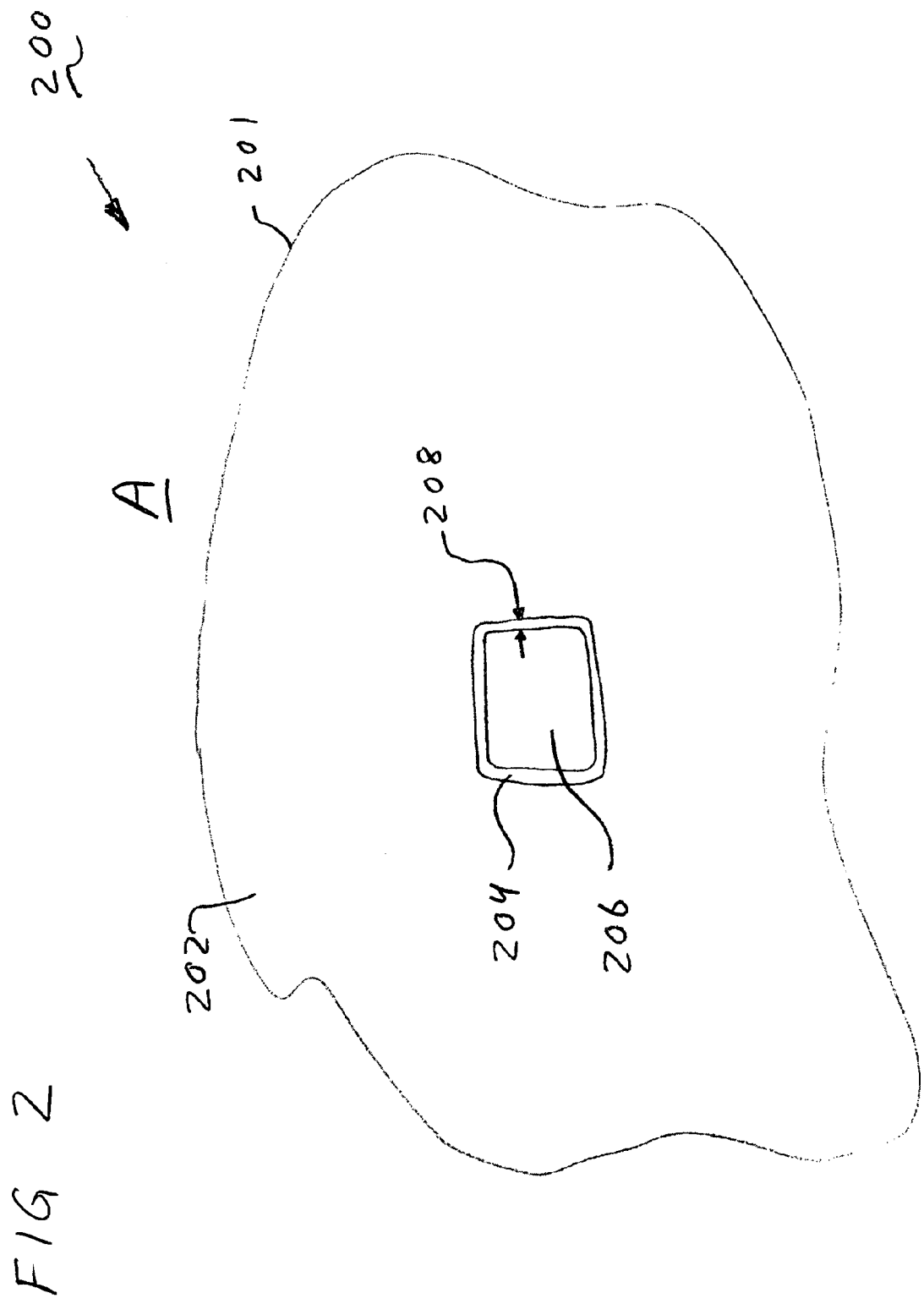
FIG. 2 illustrates partitioning a touch area, according to embodiments of the invention.

FIG. 2 illustrates partitioning a touch area, generally at 200, according to embodiments of the invention. With reference to FIG. 2, in one embodiment FIG. 2 represents a top view of FIG. 1C as indicated by reference numeral "A." A conductive layer on a surface 201 is partitioned. Before partitioning, the surface 201 had a conductive layer disposed thereon or within a thickness of the surface. FIG. 2 illustrates the result of partitioning. The conductive layer has been partitioned into a touch area 206 and a first remainder area 202, separated by a trench 204. Alternatively, the process can be thought of as isolating the touch area 206 from the rest of the conductive layer 202. The trench 204 is used to isolate the touch area 206 from the conductive layer 202. The trench has a width as indicated at 208 and represents removal of the conductive layer from the area indicated by the trench.

FIG. 3 illustrates partitioning a conductive area, generally at 300, according to embodiments of the invention. With reference to FIG. 3, the surface 201 is partitioned again resulting in a second remainder area 302 and an island 308. The trench 204 creates a touch area 206 as described in FIG. 2. A moat 304 creates an island 308 and the resulting second remainder area 302 of the original conductive layer.

The moat 304 has a thickness 306. Addition of the moat 304 to create the island 308 reduces the electrical noise picked up by the capacitive touch system that would be used with the touch area 206 in FIG. 3. In some system configurations it is advantageous to ground the remainder areas or islands such as 202 (FIG. 2), 302 (FIG. 3), 308 (FIG. 3) or 408 (FIG. 4). Bringing the remainder areas to earth ground reduces the magnitude of electrical noise that couples into the capacitive touch control system.

FIG. 4 illustrates multiple touch areas, generally at 400, according to embodiments of the invention. With reference to FIG. 4, a surface 401 has a conductive layer that has been separated into several areas. A first touch area 410 is separated by a trench 411 from an island 408. The trench 411 has a thickness indicated at 412. A second touch area 420 is separated by a trench 421 from the island 408. The trench 421 has a thickness indicated at 422. A third touch area 430 is separated from the island 408 by a trench 431. The trench 431 has a thickness indicated at 432. The remaining portion of the conductive layer after partitioning is indicated at 402. A moat 404 having a thickness indicated by 406 separates the island 408 from the larger conductive layer. An optional connection to ground is indicated at 440 between the remainder of the conductive layer 402 and earth ground. Another optional connection to ground can be made between the island 408 and earth ground.

Ground connection with a reflective layer of a mirror is accomplished by removing any protective non-conducting paint that might be applied over the conductive layer from an area approximately the size of a quarter. In one embodiment, one end of a strip of conductive copper tape is applied to this area and then the other end of the conductive copper tape is connected to any part of the mirror structure that is connected to earth ground for example a frame, cabinet, etc. It may be desirable to have more than one ground connection between the reflective area of the mirror and earth ground.

Various embodiments are used to incorporate capacitive touch control systems with surfaces having conductive layers that are large, measuring several square feet of square yards in area. Additionally, the surfaces that the capacitive touch controller is used with can be thick. For example, embodiments of the system are implemented for use with a surface made of mirror glass in excess of 6 millimeters in thickness.

For a given capacitive touch control unit, as the distance between the touch pad and the touch area increases (due to increasing surface thickness) the touch pad and touch areas should be increased in order to provide more signal to the capacitive touch controller. Increasing the sensitivity of a touch controller can also be done to sense the smaller signal resulting from the increased distance between the touch pad and the touch area.

The multiple touch areas 410, 420, and 430 are intended to permit generation of separate control signals. Therefore, it is desirable to minimize cross-talk between touch pads. The trenches 411, 421, and 431 provide capacitive isolation between touch pads. As the trench widths 412, 422, and 432 are increased, the capacitive cross-talk between touch pads is decreased. Isolation from electrical background noise that is picked up by the remainder of the conductive layer 402 is minimized by increasing the moat thickness 406.

One non-limiting example of an implementation of a capacitive touch control system with a mirror having a thickness of approximately six millimeters and an area of approximately two square meters, resulted in an island having a width of approximately 4 inches, a height of approximately 1.25 inches, a moat having a width of approximately 0.40 inch. Touch pads and touch areas of approximately 0.6 inch by 0.6 inch with trench and moat widths of 0.040 inch. Center to center spacing between touch pads of 1.3 inch. Various capacitive touch controllers can be used such as devices available from ATLab, Silicon Labs, Microchip, Cypress, ST Microelectronics, Freescale Semiconductor, Atmel, Analog Devices, and others.

FIG. 5 illustrates a capacitive touch control with a mirror, generally at 500, according to embodiments of the invention. With reference to FIG. 5, multiple touch areas 400 (in one embodiment, as shown in FIG. 4) are used in conjunction with a capacitive touch control system incorporated with a mirror 502. The touch control is configured to control backlight illumination within the mirror via light emitted from backlights 504 and 506.

Capacitive touch controls provide inputs to an electronic control board, attached to the backside of the mirror (described above in conjunction with the preceding figures) that perform various functionality. In various embodiments, the electronic controls can include a processor that receives inputs from the touch controls and executes predefined functions in response thereto. A user touches one of the control areas to create a change in the capacitive circuit attached to the mirror coating on the back side of the mirror. The user's touch and corresponding change in the capacitive circuit attached thereto trigger a change in an electronic component associated with the touch control. A non-limiting list of electronic components that can be controlled by the touch controls are: lighting on/off, light intensity, light intensity as modulated by the presence of a user sensed by a proximity sensor, user controllable functions associated with a media display device, such but not limited to volume, channels, power, etc.

In various embodiments, energy saving features are employed through an interactive use model with a user. For example, on power up, the built-in control brings up a light level to a value, which is less that full power, such as for example 30%, then after a period of time the control will increase light output to higher power until full power is reached. If a user lowers the power level of the light then the control will maintain that power level until the user changes it again.

A night light feature provides a low power state to save energy. The night light feature can set the amplitude of light output to as low as 1% of maximum. Night light amplitude is also user definable using the controls on the capacitive touch pad.

If a user brings the amplitude below 30%, for example to 5% the light output stays at 5%. A proximity sensor senses whether a user is within a predefined distance of the mirror and lowers the light if a user is not within the predefined range.

Percentages and values listed herein are given for illustration only. Embodiments of the invention are not limited thereby.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described. The description is thus to be regarded as illustrative instead of limiting.

What is claimed is:

1. An apparatus comprising:
a surface, the surface has a conductive layer within a thickness of the surface:
a trench, the trench is formed in the conductive layer to define a touch area, the touch area is isolated from the rest of the conductive layer; and
a conductive pickup, the conductive pickup is mounted on a back side of the surface over the touch area and the conductive pickup is electrically connected to a capacitive touch controller, such that when a user touches the touch area on a front side of the conductive the touch controller responds to the user's touch.

2. The apparatus of claim 1, wherein the surface is a mirror and the conductive layer is a reflective layer in a mirror.

3. The apparatus of claim 1, further comprising:
an optical to electrical converter, the optical to electrical converter provides a signal connection between the capacitive touch controller and a fluorescent light.

4. An apparatus comprising:
a mirror, the mirror has a reflective layer, the reflective layer is conductive and the reflective layer reflects light;
a trench, the trench is formed in the reflective layer to define a touch area of the reflective layer that is isolated from the rest of the reflective layer; and
a conductive pickup, the conductive pickup is mounted on a back side of the mirror over the touch area and the conductive pickup is electrically connected to a capacitive touch controller, such that when a user touches the touch area on a front side of the mirror the touch controller responds to the touch.

5. The apparatus of claim 4, wherein the conductive pickup is approximately the same size as the touch area.

6. The apparatus of claim 4, further comprising:
an electrical ground, the electrical ground is connected from the reflective layer to a system ground.

7. The apparatus of claim 4, further comprising:
a moat, the moat is formed in the reflective layer around the touch area, the moat defines a region of reflective layer between the trench and the moat.

8. A method comprising:
partitioning a conductive layer of a surface into a touch area and a first remainder area with a trench to isolate the touch area from the first remainder area;
mounting a pickup over the touch area; and
electrically connecting the pickup to an input of a capacitive touch controller, wherein when a user touches the touch area, the capacitive touch controller generates a response.

9. The method of clam 8, further comprising:
partitioning the first remainder area into an island and a second remainder area, wherein the island surrounds the touch area.

10. The method of claim 9, further comprising:
partitioning a second touch area from the second remainder area.

11. The method of claim 9, further comprising:
grounding the conductive layer.

12. The method of claim 8, further comprising:
using the response to control an electronic device.

13. The method of claim 12, wherein the electronic device is a light.

14. The method of claim 8, wherein the conductive layer is a reflective layer of a mirror.

* * * * *